US010153173B2

(12) United States Patent
Ku et al.

(10) Patent No.: US 10,153,173 B2
(45) Date of Patent: Dec. 11, 2018

(54) METHOD FOR WET ETCHING OF BLOCK COPOLYMER SELF-ASSEMBLY PATTERN

(71) Applicant: LG Chem, Ltd., Seoul (KR)

(72) Inventors: Se Jin Ku, Daejeon (KR); Eun Young Choi, Daejeon (KR); Sung Soo Yoon, Daejeon (KR); No Jin Park, Daejeon (KR); Jung Keun Kim, Daejeon (KR); Je Gwon Lee, Daejeon (KR); Mi Sook Lee, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/547,688

(22) PCT Filed: Feb. 2, 2016

(86) PCT No.: PCT/KR2016/001115
§ 371 (c)(1),
(2) Date: Jul. 31, 2017

(87) PCT Pub. No.: WO2016/133301
PCT Pub. Date: Aug. 25, 2016

(65) Prior Publication Data
US 2018/0033638 A1 Feb. 1, 2018

(30) Foreign Application Priority Data

Feb. 17, 2015 (KR) .................. 10-2015-0024057

(51) Int. Cl.
*H01L 21/311* (2006.01)
*H01L 21/67* (2006.01)
(Continued)

(52) U.S. Cl.
CPC .... *H01L 21/31133* (2013.01); *H01L 21/0271* (2013.01); *H01L 21/02118* (2013.01);
(Continued)

(58) Field of Classification Search
CPC ......... H01L 21/02118; H01L 21/02356; H01L 21/0271; H01L 21/31133; H01L 21/67;
(Continued)

(56) References Cited

U.S. PATENT DOCUMENTS

2007/0080107 A1* 4/2007 Yang .................. B01D 67/0034
210/490
2008/0299774 A1 12/2008 Sandhu
(Continued)

FOREIGN PATENT DOCUMENTS

KR 20100032397 A 3/2010
KR 20110037718 A 4/2011
KR 101462207 B1 11/2014

OTHER PUBLICATIONS

International Search Report From PCT/KR2016/001115 dated May 9, 2016.

*Primary Examiner* — Lan Vinh
(74) *Attorney, Agent, or Firm* — Lerner, Davis, Littenberg, Krumholz & Mentlik, LLP

(57) ABSTRACT

The present invention relates to a process for selectively removing a block on one side using a wet etching process in connection with self-assembly block copolymer thin films that have etching-resisting properties different from each other. The present invention can form a vertical nanopore structure having a high aspect ratio, even in the case of a thick film which has a vertically oriented cylinder self-assembly structure and which has one or more periods, by overcoming the limit of the prior art, which cannot implement a vertical pore structure through wet etching.

8 Claims, 2 Drawing Sheets

(51) Int. Cl.
   *H01L 21/02*      (2006.01)
   *H01L 21/027*     (2006.01)
   H01L 21/3105     (2006.01)
   H01L 21/3065     (2006.01)

(52) U.S. Cl.
   CPC ........ *H01L 21/02356* (2013.01); *H01L 21/67* (2013.01); *H01L 21/30655* (2013.01); *H01L 21/31055* (2013.01)

(58) Field of Classification Search
   CPC ......... H01L 21/31055; H01L 21/30655; H01L 21/02057
   USPC ...... 438/692, 694, 750, 754; 216/83, 99, 88, 216/90
   See application file for complete search history.

(56) References Cited

U.S. PATENT DOCUMENTS

| | | | |
|---|---|---|---|
| 2011/0081777 A1 | 4/2011 | Yoon et al. | |
| 2011/0201201 A1* | 8/2011 | Arnold ................... | B82Y 30/00 438/694 |
| 2011/0300699 A1* | 12/2011 | Molas ............... | H01L 21/28282 438/586 |
| 2013/0115732 A1* | 5/2013 | Guo .................. | H01L 31/02363 438/98 |
| 2013/0133825 A1 | 5/2013 | Hattori et al. | |
| 2013/0189504 A1* | 7/2013 | Nealey ................... | B82Y 30/00 428/201 |
| 2013/0273330 A1 | 10/2013 | Wang et al. | |
| 2015/0357197 A1* | 12/2015 | Peethala ........... | H01L 21/30604 438/749 |

\* cited by examiner

[Figure 1]
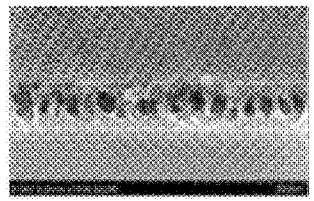
[Figure 2]
[Figure 3]
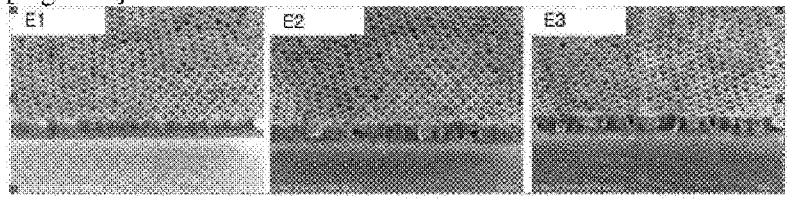
[Figure 4]
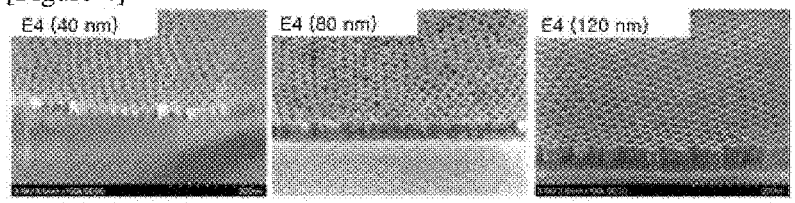
[Figure 5]
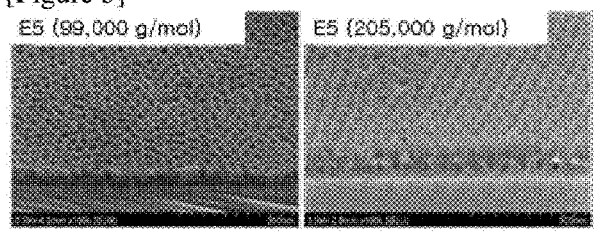

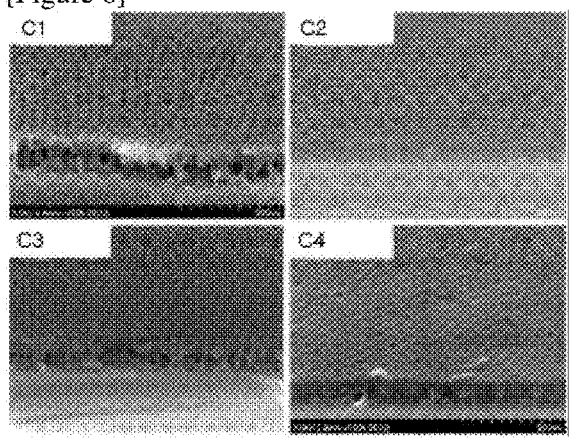
[Figure 6]

METHOD FOR WET ETCHING OF BLOCK COPOLYMER SELF-ASSEMBLY PATTERN

CROSS-REFERENCE TO RELATED APPLICATION

This application is a national phase entry under 35 U.S.C. § 371 of International Application No. PCT/KR2016/001115, filed Feb. 2, 2016, which claims priority to Korean Patent Application No. 10-2015-0024057, filed on Feb. 17, 2015, the disclosures of which are incorporated herein by reference.

TECHNICAL FIELD

The present invention relates to a method for selectively removing one block of a block copolymer self-assembled structure using a wet etching process. More specifically, the present invention relates to a method for obtaining a vertical pore structure formed with a high aspect ratio by applying a wet etching process without structural collapses and porous shape defects, when a self-assembled structure of a vertically oriented block copolymer is wet-etched for a thick film having a self-assembled structure of at least one period.

BACKGROUND ART

Conventional nanopatterning techniques have mainly been made to develop processes capable of forming more precise and finer patterns using a photolithography technique. However, this technique has already reached a limitation of technology due to a resolution limitation resulting from wavelengths of light. Accordingly, a self-assembled structure control process of block copolymers is emerging as a new alternative method for nanolithography.

The block copolymer is a polymer in which blocks having different chemical compositions and structures are linked together with forming covalent bonds, where blocks having different characteristics in one molecule result in microphase separation, while the characteristics to cause phase separation are offset by covalent bonds, and eventually form a nanostructure through a specific shape (spherical, cylindrical, layered, etc.) periodic arrangement. This provides an optimal system capable of forming a fine pattern with high resolution. In addition, since the nanostructure formed by the block copolymer can be also controlled in the shape as well as the size and selected for chemical properties, they have an advantage in being applied to a nanotechnology field.

In order to apply the self-assembled structure of the block copolymer to nanolithography, it is necessary to selectively remove one block polymer through various etching processes. The wet etching process does not require high-vacuum equipments as in a dry process, and thus has an advantage that it can be applied to a large-area substrate through an inexpensive and simple process.

However, despite these advantages, in the case of the conventional wet etching method, it is possible to perform a selective etching without defects in a thin film having a thickness of up to one period in the self-assembled structure of the block copolymer (see FIG. 2), but if the thickness of the block copolymer thin film exceeds one period of the self-assembly structure, there is a problem that the porous defects appear as in FIG. 1.

For example, in the case of the best known polystyrene-block-polymethyl methacrylate (PS-b-PMMA) block copolymer, when the vertically oriented cylinder self-assembled structure is etched, it can be confirmed that the PMMA block is selectively removed by a simple process of dipping it in acetic acid and then washing it with distilled water, but it can be confirmed that the closer to the bottom of the thin film, that is, to the substrate, the porous shape defects appear (see FIG. 1). As a result, a cylinder hole pattern vertically formed on the substrate could not be obtained, and thus there was a limit to obtain a vertical pore structure having a high aspect ratio through the conventional wet etching process conditions.

DISCLOSURE OF INVENTION

Technical Problem

It is an object of the present invention to provide a wet etching method capable of forming a nanostructure without structural collapses or porous defects even in a thick film in selectively removing one block of a self-assembled structure of a vertically oriented block copolymer.

Technical Solution

In order to achieve the aforementioned object, the present invention provides a method for wet etching a block copolymer self-assembled pattern characterized in that one block of the block copolymer is selectively removed by impregnating a block copolymer thin film having a vertically oriented self-assembled structure with a plurality of wet etching solutions having different concentrations sequentially.

In the present invention, the concentrations of each etching solution may be independently 95 to 100%.

In the present invention, the concentration difference of each etching solution may be within 5%.

In the present invention, the concentration of a first etching solution may be 99 to 100%.

In the present invention, the concentrations of each etching solution may be sequentially reduced.

In the present invention, the impregnation may be practiced at least 2 times.

In the present invention, the etching solution may be an acetic acid solution.

In the present invention, a thickness of the block copolymer thin film may be 0.5 to 11 $L_o$, wherein $L_o$ may be a period of the self-assembled structure.

In the present invention, the block removed by etching may be an acrylate-based block or a methacrylate-based block.

In the present invention, the block removed by etching may be selected from polymethyl methacrylate, polymethyl acrylate, polybutyl methacrylate, poly-tert-butyl methacrylate, poly-tert-butyl acrylate, polyhydroxyethyl methacrylate.

In the present invention, the self-assembled structure of the block copolymer may be a vertically oriented cylinder pattern.

In addition, the present invention provides a method for producing a nanostructure comprising steps of forming a block copolymer thin film on a surface-treated substrate; forming a vertically oriented self-assembled structure of the block copolymer through a heat treatment or a solvent annealing of the block copolymer thin film; and performing the aforementioned wet etching method.

When using the wet etching process in accordance with the present invention, a vertical nanopore structure having a high aspect ratio that could not be controlled by the conventional wet etching method can be manufactured. As a result, it is possible to provide a nanopatterning process which can be applied to a large area substrate with a simple and inexpensive process as compared with the dry etching requiring a high vacuum chamber.

BRIEF DESCRIPTION OF DRAWINGS

FIG. 1 is a SEM (scanning electron microscope) photograph showing the result of etching a film having a thickness exceeding one period of a self-assembled structure of a block copolymer by a conventional wet etching method.

FIG. 2 is a SEM photograph showing the result of etching a film having a thickness of up to one period of a self-assembled structure of a block copolymer by a conventional wet etching method.

FIG. 3 is SEM photographs showing the results of Examples 1 to 3.

FIG. 4 is SEM photographs showing the results of Example 4.

FIG. 5 is SEM photographs showing the results of Example 5.

FIG. 6 is SEM photographs showing the results of Comparative Examples 1 to 4.

MODE FOR CARRYING OUT INVENTION

Hereinafter, the present invention will be described in detail.

To solve the problems of the prior art, the present inventors first analyzed causes of porous defects resulted from the conventional wet etching processes. As a result, it was confirmed as in FIG. 1 to be a phenomenon that when the thin film of the block copolymer which had been immersed in the high concentration etching solution was immediately immersed in a cleaning solvent such as water, the blocks etched from the bottom part of the film were rapidly washed out due to the sharp concentration difference of the etching solution between the film surface and the bottom part.

To solve this, the present invention attempts to eliminate the above defective phenomenon through a concentration gradient of an etching solution. Accordingly, it is possible to develop a wet etching process capable of forming a nanostructure without structural collapses or porous defects even in a thick film having a self-assembled structure of at least one period which could not be achieved by the conventional technique.

The method for wet etching a block copolymer self-assembled pattern according to the present invention is characterized by selectively removing one block of the block copolymer by impregnating the block copolymer thin film having the vertically oriented self-assembled structure with a plurality of wet etching solutions having different concentrations of solutions sequentially.

In the present invention, the etching solution may be composed of an etching agent alone, or composed of an etching agent and a diluent. Although the type of the etching agent is not particularly limited, it may vary depending on the type of the block copolymer, and for example when the block copolymer comprises an acrylic block, acetic acid may be preferably use as the etching agent. Acetic acid is easy to selectively etch the polymer block comprising acrylate or methacrylate in the main chain.

As the diluents, water (distilled water etc.) or alcohol and the like may be used. The diluent may also function as a washing agent. Therefore, when the diluent is used, a separate washing process may be unnecessary. That is, since at least one solution from a plurality of etching solutions is a dilute solution diluted with a washing agent such as water, it is not necessary to separately wash the thin film after impregnating with the etching solution. At least one solution of a plurality of etching solutions must contain a diluent, otherwise the etching may not be performed or may occur insufficiently.

In the present invention, the concentration of the etching solution may mean a volume percent (vol/vol %, v/v %) concentration. That is, it may mean a percentage of volume occupied by the etching agent relative to the total volume of the etching solution. For example, a 100% etching solution is a solution consisting of only the etching agent, and a 95% etching solution is a solution consisting of 95% by volume of the etching agent and 5% by volume of the diluent.

Concentrations of each etching solution may be independently 95 to 100%. If the concentration of the etching solution is less than 95%, the etching may not be performed or may occur insufficiently, and the porous defects may also increase.

The concentration difference of each etching solution may be within 5%, preferably 3%, more preferably 2% and most preferably 1%. The concentration difference of each etching solution may be as small as possible, and the greater the concentration difference, the porous defects may increase.

The concentration of the first (primary) etching solution may be as high as possible, preferably 99 to 100%, more preferably 100%.

The concentrations of each etching solution may be sequentially reduced. For example, as illustrated in Example 1, the concentrations can be gradually reduced in order such that the concentration of the primary etching solution is 100%, the concentration of the secondary etching solution is 99% and the concentration of the tertiary etching solution is 98%. Thus, when the concentration of each etching solution is sequentially decreased while minimizing the concentration difference of each etching solution, the porous defects can be remarkably reduced.

Of course, as illustrated in Example 3, a pattern to have reduced the concentration of the etching solution and increase it again is also possible, but a gradual decrease of the concentration gradient may be effective in terms of defect improvement.

The number of times of impregnation must be at least 2 times so as to form a concentration gradient, and preferable, may be practiced at least 3 times. The maximum number of times of impregnation may be, for example, up to 10 times.

An impregnating time may be, for example, 10 seconds to 10 minutes, preferably 20 seconds to 6 minutes and more preferably 30 seconds to 3 minutes, independently for each etching solution.

An impregnating method may be a batch or continuous method. For example, it may be a method in which a plurality of etching solutions having concentrations different from each other are separately placed in a plurality of containers, respectively and the block copolymer thin film is impregnated in each container sequentially.

The block copolymer may be a block copolymer in a form that a block having low etching-resisting properties and a block having high etching-resisting properties are covalently bonded. For example, the block having low etching-resisting properties may be mainly a polymer block comprising acrylate or methacrylate in the main chain. That is, the block removed by etching may be an acrylate-based block or a methacrylate-based block. Specifically, for example, the block which has low etching-resisting properties to be removed by etching may be selected from polymethyl methacrylate (PMMA), polymethyl acrylate (PMA), poly butyl methacrylate (PBuMA), poly-tert-butyl methacrylate (PtBMA), poly-tert-butyl acrylate (PtBA) and polyhydroxyethyl methacrylate (PHEMA). The block having high etching-resisting properties may be polystyrene, etc.

The block copolymer may have a number average molecular weight of, for example, 1,000 to 500,000 g/mol, preferably 10,000 to 300,000 g/mol. The block copolymer may have a polydispersity index (PDI, =Mw/Mn) of, for example, 1.5 or less, preferably 1.1 or less. A volume ratio of the block having low etching-resisting properties may be, for example, 10 to 50%, preferably 20 to 40%. The self-assembled structure of the block copolymer may be a vertically oriented cylinder pattern.

The block copolymer thin film may have a thickness of 0.5 to 11 $L_o$. Here, $L_o$ may be a period (a repeating unit or a distance between cylinder centers) of the self-assembled structure. In particular, for the thick film exceeding one period as well, the vertically oriented self-assembled pattern of the block copolymer formed with a high aspect ratio may be obtained by applying a wet etching process without structural collapses or porous shape defects.

The present invention also provides a method for producing a nanostructure. The method for producing a nanostructure according to the present invention comprises steps of forming a block copolymer thin film on a surface-treated substrate; forming a vertically oriented self-assembled structure of the block copolymer through a heat treatment or a solvent annealing of the block copolymer thin film; and performing the aforementioned wet etching method.

The substrate may be, for example, a silicon wafer substrate and the like. The surface treatment of the substrate may be, for example, a surface neutralization treatment. The block copolymer thin film may be formed, for example, by a spin coating method and the like. The vertically oriented self-assembled structure of the block copolymer may be formed by a heat treatment or a solvent annealing. The heat treatment temperature may be, for example, 150 to 300° C. and the heat treatment time may be, for example, 0.5 to 2 hours. After forming the self-assembled pattern, the thin film can be irradiated with ultraviolet light. A drying process may be performed after etching.

EXAMPLES

Hereinafter, in Examples, the vertically oriented cylinder structure of the block copolymer was produced through a wet etching process. The block copolymer used in Examples was polystyrene-block-polymethyl methacrylate (PS-b-PMMA), where a number average molecular weight was about 41,000 to about 210,000 g/mol, PDI was 1.1 or less and a volume ratio of the PMMA block was 27 to 35%, and a material capable of self-assembling into a PMMA cylinder shape in the PS matrix was used. First, to vertically orient the self-assembled structure, a silicon wafer substrate was subjected to a surface neutralization treatment. The PS-b-PMMA block copolymer was spin-coated on the neutralized substrate to a desired thickness and then heat-treated at 200 to 250° C. for about 1 hour to form a cylinder self-assembled pattern vertically oriented on the substrate. The patterned block copolymer thin film was irradiated with ultraviolet having a wavelength of about 254 nm at about 3 to 7 J using a UV crosslinker (XL-1000), and then only the PMMA block was selectively etched by impregnating the thin film with each batch of acetic acid etching solutions having different concentration gradients for about 30 seconds to 3 minutes at least 2 times alternatively and drying it.

Example 1

A block copolymer of PS46k-b-PMMA21 k (PS 46,000 g/mol, PMMA 21,000 g/mol, the distance between cylinder centers $L_o$=40 nm) was used and for the block copolymer thin film having a thickness of about 80 nm ($2L_o$), a vertically oriented cylinder self-assembled structure was formed according to the aforementioned method. Then, the thin film was impregnated with a 100% acetic acid etching solution for about 30 seconds to 3 minutes, then impregnated with a 99% acetic acid etching solution for about 30 seconds to 3 minutes and finally impregnated with a 98% acetic acid etching solution for about 30 seconds to 3 minutes, and then dried.

Example 2

The method was practiced following Example 1 except that the thin film was sequentially impregnated with varying the concentration of the acetic acid etching solution to 100%→98%→95% in order.

Example 3

The method was practiced following Example 1 except that the thin film was sequentially impregnated with varying the concentration of the acetic acid etching solution to 100%→98%→100%→98% in order.

Example 4

The method was practiced following Example 1 except for differently coating the thicknesses of the block copolymer thin film to 40 nm ($1L_o$), 80 nm ($2L_o$) and 120 nm ($3L_o$), respectively.

Example 5

The method was practiced following Example 1 except for changing the block copolymers having different molecular weights as PS64k-b-PMMA35k (PS 64,000 g/mol, PMMA 35,000 g/mol, the distance between cylinder centers $L_o$=50 nm) and PS140k-b-PMMA65k (PS 140,000 g/mol, PMMA 65,000 g/mol, the distance between cylinder centers $L_o$=85 nm), respectively and wet etching the block copolymer thin films having each thin film thickness of about $2L_o$.

Comparative Example 1

The method was practiced following Example 1 except for impregnating the thin film with the 100% acetic acid solution and immediately washing it with distilled water.

Comparative Example 2

The method was practiced following Example 1 except for impregnating the thin film with the 100% acetic acid solution and then immediately drying without washing it with distilled water.

Comparative Example 3

The method was practiced following Example 1 except for impregnating the thin film with the 100% acetic acid solution and then with the 95% acetic acid diluted solution, and drying.

Comparative Example 4

The method was practiced following Example 1 except for impregnating the thin film with the 90% acetic acid diluted solution and immediately washing it with distilled water.

Test Example

After observing the nanopattern shapes of the block copolymers according to the above Examples and Comparative Examples by a SEM (scanning electron microscope), etching and defects were evaluated according to the following evaluation criteria, and the results were shown in Table 1 and FIGS. 3 to 6.

TABLE 1

|  | Etching | Defects |
| --- | --- | --- |
| Example 1 | ⊚ | 1 |
| Example 2 | ○ | 2 |
| Example 3 | ○ | 2 |
| Example 4 | ○ | 1 |
| Example 5 | ⊚ | 1 |
| Comparative Example 1 | ○ | 3 |
| Comparative Example 2 | x | 1 |
| Comparative Example 3 | ○ | 3 |
| Comparative Example 4 | x | 2 |

<Defect Evaluation>

1: there was almost no porous defect and vertical pore structure developed.

2: very small porous defects were confirmed, but overall vertical pore structure developed.

3: there were many porous defects.

<Shape Evaluation Results>

SEM cross-section results of Examples 1 to 3 were shown in FIG. 3. In FIG. 3, E refers to an example.

SEM cross-section results of Example 4 were shown in FIG. 4. In FIG. 4, E refers to an example and the thin film thicknesses are indicated in the parentheses.

SEM cross-section results of Example 5 were shown in FIG. 5. In FIG. 5, E refers to an example and the molecular weights are indicated in the parentheses.

SEM cross-section results of Comparative Examples 1 to 4 were shown in FIG. 6. In FIG. 6, C refers to a comparative example.

According to Table 1 and FIGS. 3 to 6, etching was successfully done in all Examples. In the case of Comparative Example 2, since it was impregnated with only the 100% solution and was not washed, etching was not almost achieved. In the case of Comparative Example 4, since the concentration of the etching solution was too low, etching was not almost achieved.

In the case of Example 1, there was almost no porous defect and vertical pore structure well developed by sequentially reducing the concentration of each etching solution, while minimizing the concentration difference of each etching solution.

In the case of Example 2, since the concentration difference of each etching solution was relatively large over Example 1, very small porous defects were confirmed.

In the case of Example 3, since the concentration difference of each etching solution was relatively large over Example 1 and the concentration was increased or decreased, very small porous defects were confirmed.

Referring to Example 4, though the thin film thickness corresponds to twice and three times of the self-assembled structure period, that is, even in a thick film, the excellent results could be obtained the same as in Example 1.

Referring to Example 5, though the molecular weight of the block copolymer is large, that is, even when the high molecular weight block copolymer is used, the excellent results could be obtained the same as in Example 1.

In the case of Comparative Example 1, since only one solution having one concentration was used, there were many porous defects.

In the case of Comparative Example 2, since the etching was not almost done, there was almost no porous defect.

In the case of Comparative Example 3, since the concentration difference of each etching solution was too large, there were many porous defects.

In the case of Comparative Example 4, since only one solution having one concentration was used and the concentration of the etching solution was too low, porous defects were confirmed.

The invention claimed is:

1. A method for wet etching a block copolymer self-assembled pattern characterized in that one block of the block copolymer is selectively removed by impregnating a block copolymer thin film having a vertically oriented self-assembled structure with a plurality of wet etching solutions having different concentrations sequentially,
   wherein the concentrations of each etching solution are independently 95 to 100%,
   wherein the concentration difference of each etching solution is within 5%,
   wherein the concentration of a first etching solution is 99 to 100%, and
   wherein the concentrations of each etching solution are sequentially reduced.

2. The method for wet etching a block copolymer self-assembled pattern according to claim 1, characterized in that the impregnation is practiced at least 2 times.

3. The method for wet etching a block copolymer self-assembled pattern according to claim 1, characterized in that the etching solution is an acetic acid solution.

4. The method for wet etching a block copolymer self-assembled pattern according to claim 1, characterized in that a thickness of the block copolymer thin film is 0.5 to 11 Lo, wherein Lo is a period of the self-assembled structure.

5. The method for wet etching a block copolymer self-assembled pattern according to claim 1, characterized in that the block removed by etching is an acrylate-based block or a methacrylate-based block.

6. The method for wet etching a block copolymer self-assembled pattern according to claim 1, characterized in that the block removed by etching is selected from polymethyl methacrylate, polymethyl acrylate, polybutyl methacrylate, poly-tert-butyl methacrylate, poly-tert-butyl acrylate and polyhydroxyethyl methacrylate.

7. The method for wet etching a block copolymer self-assembled pattern according to claim 1, characterized in that the self-assembled structure of the block copolymer is a vertically oriented cylinder pattern.

8. A method for producing a nanostructure comprising steps of
   forming a block copolymer thin film on a surface-treated substrate;
   forming a vertically oriented self-assembled structure of the block copolymer through a heat treatment or a solvent annealing of the block copolymer thin film; and
   performing the wet etching method according to claim 1.

\* \* \* \* \*